(12) United States Patent
Ito et al.

(10) Patent No.: US 10,798,858 B2
(45) Date of Patent: Oct. 6, 2020

(54) COMPONENT MOUNTING DEVICE AND METHOD FOR CAPTURING IMAGE OF NOZZLE A COMPONENT MOUNTING DEVICE

(71) Applicant: YAMAHA HATSUDOKI KABUSHIKI KAISHA, Iwata-shi, Shizuoka-ken (JP)

(72) Inventors: Kota Ito, Shizuoka (JP); Junya Matsuno, Shizuoka (JP)

(73) Assignee: YAMAHA HATSUDOKI KABUSHIKI KAISHA, Iwata-shi, Shizuoka-ken (JP)

(*) Notice: Subject to any disclaimer, the term of this patent is extended or adjusted under 35 U.S.C. 154(b) by 267 days.

(21) Appl. No.: 16/085,909

(22) PCT Filed: Mar. 24, 2016

(86) PCT No.: PCT/JP2016/059417
§ 371 (c)(1),
(2) Date: Sep. 17, 2018

(87) PCT Pub. No.: WO2017/163377
PCT Pub. Date: Sep. 28, 2017

(65) Prior Publication Data
US 2019/0116699 A1    Apr. 18, 2019

(51) Int. Cl.
*B23P 19/00* (2006.01)
*H05K 13/04* (2006.01)
*H05K 13/08* (2006.01)

(52) U.S. Cl.
CPC ....... *H05K 13/0409* (2018.08); *H05K 13/041* (2018.08); *H05K 13/0413* (2013.01); *H05K 13/0812* (2018.08); *H05K 13/0813* (2018.08)

(58) Field of Classification Search
CPC ............. H05K 13/0409; H05K 13/041; H05K 13/0413; H05K 13/0812; H05K 13/0813
See application file for complete search history.

(56) References Cited

U.S. PATENT DOCUMENTS

| | | | |
|---|---|---|---|
| 10,440,868 B2* | 10/2019 | Iwasaki | H05K 13/0409 |
| 10,653,051 B2* | 5/2020 | Ikeda | H05K 13/04 |
| 10,716,250 B2* | 7/2020 | Fujishiro | H05K 13/0409 |

FOREIGN PATENT DOCUMENTS

| | | |
|---|---|---|
| JP | 2005-286171 A | 10/2005 |
| JP | 2008-182095 A | 8/2008 |

(Continued)

OTHER PUBLICATIONS

International Search Report issued in PCT/JP2016/059417; dated Jun. 14, 2016.

*Primary Examiner* — Paul D Kim
(74) *Attorney, Agent, or Firm* — Studebaker & Brackett PC

(57) ABSTRACT

After one suction nozzle turns from one arrangement pitch ahead of a work position toward the work position and immediately before the suction nozzle starts descent at the work position, an image of a side portion of the suction nozzle is captured. Parameters are used for controlling the imaging operation. The parameters include descent start timing when each of the suction nozzles starts descent during mounting of an electronic component, and data required for determining an imaging time necessary from when a camera starts imaging of the suction nozzle until the camera ends the imaging. Imaging is completed immediately before the one suction nozzle starts descent at the work position.

20 Claims, 6 Drawing Sheets

(56) References Cited

FOREIGN PATENT DOCUMENTS

| | | |
|---|---|---|
| JP | 2009-130014 A | 6/2009 |
| JP | 2014-220269 A | 11/2014 |

\* cited by examiner

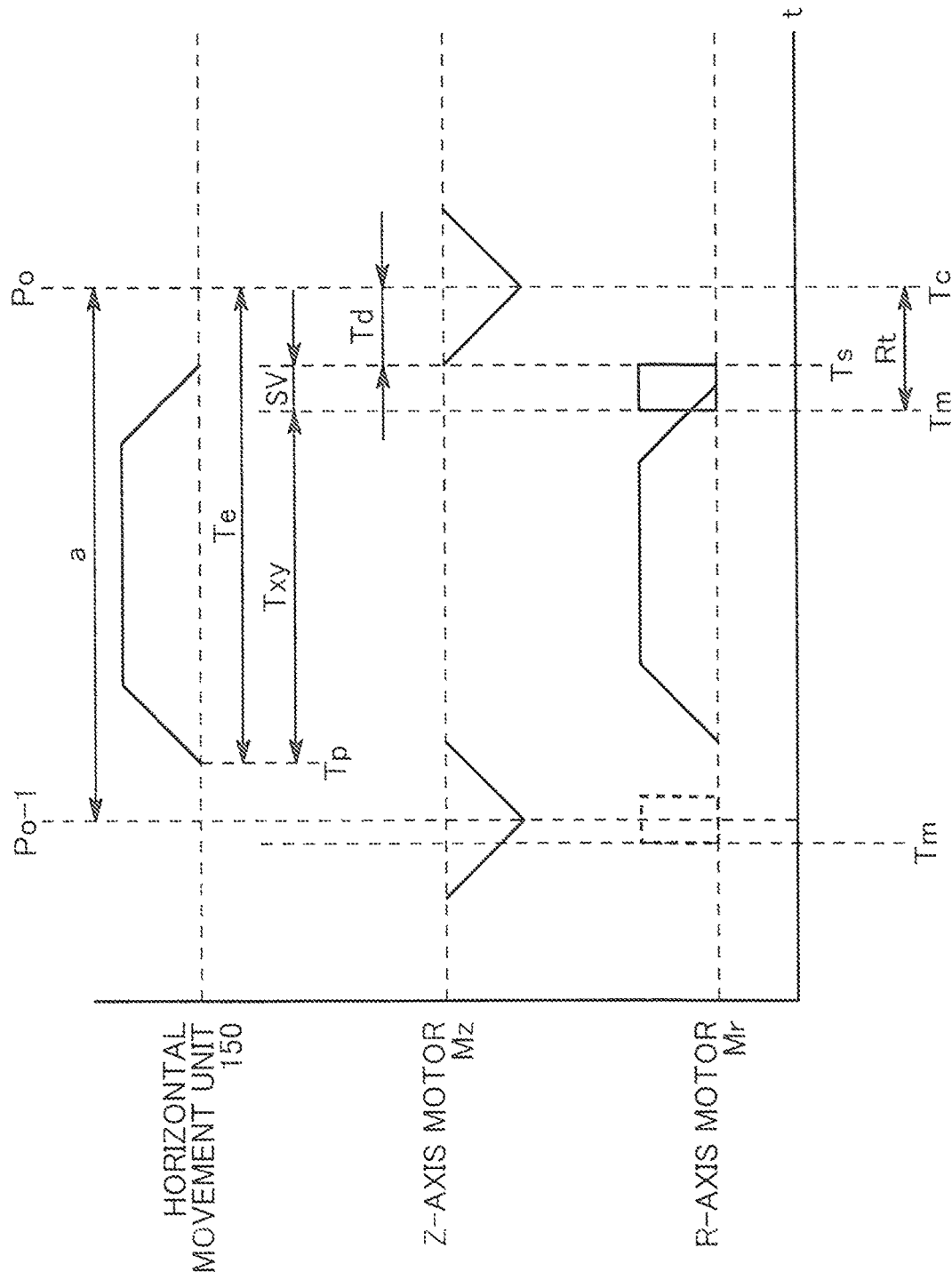

COMPONENT MOUNTING DEVICE AND METHOD FOR CAPTURING IMAGE OF NOZZLE A COMPONENT MOUNTING DEVICE

CROSS-REFERENCE TO RELATED APPLICATION

This application is a National Stage of International Patent Application No. PCT/JP2016/059417, filed Mar. 24, 2016, the entire content of which is incorporated herein by reference.

BACKGROUND

Technical Field

The present disclosure relates to a component mounting device and a method for capturing an image of a nozzle thereof. In particular, the present disclosure relates to a component mounting device according to a suction nozzle imaging technique of capturing, in a component mounting device including a nozzle head which supports a plurality of suction nozzles disposed on the same circumference, images of the suction nozzles, and a method for capturing images of the nozzles.

Background Art

Unexamined Japanese Patent Publication No. 2014-220269 and Unexamined Japanese Patent Publication No. 2009-130014 disclose component mounting devices of this kind. These component mounting devices, each including a plurality of suction nozzles arranged on the same circumference so as to be centered around a vertical line set on a mounting head, sequentially position each of the suction nozzles at a work position by intermittently rotating each of the suction nozzles by one pitch each around the vertical line in a fixed direction, thereby mounting an electronic component by the suction nozzle at the work position.

The component mounting device disclosed in Unexamined Japanese Patent Publication No. 2014-220269 is configured to capture an image of a side portion of a suction nozzle which has conducted suction/take-out (pick-up) operation to check a suction state of a component. The component mounting device includes a storage device which stores, as an imaging angle position, a fixed value set for each of the suction nozzles in advance, rotation angle detection means which detects a rotation angle of a suction nozzle to be captured, and control means which conducts control to capture an image of the suction nozzle having moved to the imaging angle position by detecting the imaging angle position by the rotation angle detection means. The fixed value is set to be half that of a case where each of the suction nozzles moves by one pitch.

The component mounting device disclosed in Unexamined Japanese Patent Publication No. 2009-130014 is configured such that while a nozzle holder stops rotation to cause a suction nozzle positioned at a work position to descend and suck an electronic component, images of a suction nozzle at a preceding position upstream of the suction position in a rotation direction and a suction nozzle at a downstream succeeding position are simultaneously captured and obtained on one screen (paragraph 0044, etc.).

SUMMARY

However, in any of the above prior art, sufficient performance cannot be delivered for checking drop-off or the like of the electronic component before mounting of a sucked electronic component.

Specifically, in the technique recited in Unexamined Japanese Patent Publication No. 2014-220269, an image of a side portion of a suction nozzle having conducted suction/take-out (pick-up) operation is simply captured to check a suction state of a component, and after the end of the check, check by capturing the image of the side portion is not conducted in a process of moving a nozzle holder onto a substrate to mount an electronic component (paragraph 0042). Therefore, a state of a sucked electronic component after the start of mounting operation cannot be reliably checked.

In the technique recited in Unexamined Japanese Patent Publication No. 2009-130014, since an image of each of the suction nozzles is captured in a stopped state, it is not possible, after a stopped suction nozzle rotates, to detect fall-off or the like of an electronic component which has been sucked by the suction nozzle.

Delaying timing for capturing an image of a suction nozzle to immediately before mounting enables an image with relatively high reliability to be obtained. However, since imaging requires time for causing an imaging element to discharge for resetting, or the like, unnecessary delay of timing is not preferable because temporary stop of mounting work for imaging is required to result in reducing a throughput.

Accordingly, the present disclosure, which has been made in view of the above problems, provides a component mounting device capable of obtaining a checked image with as high reliability as possible without requiring to wait for imaging when checking a suction nozzle yet to be mounted by imaging, and a method for capturing an image of a nozzle thereof.

A first aspect of the present disclosure is a component mounting device including a nozzle holder configured to be turnable around an axis; and a plurality of suction nozzles configured to be capable of sucking an electronic component. The suction nozzles are disposed along a circumference concentric with a center of rotation of the nozzle holder and at an interval of an arrangement pitch in a circumference direction. The component mounting device further includes horizontal movement means configured to allow the nozzle holder to move on a plane such that the suction nozzle at a work position set on the circumference in advance moves between a position for sucking an electronic component and a position for mounting a sucked electronic component; turning means configured to allow the nozzle holder to be turnable along the circumference such that each of the suction nozzles alternatively moves to the work position; and up-down means configured to allow the suction nozzle at the work position to go up and down. In addition, the component mounting device includes a camera configured to be capable of capturing an image of a side portion of the suction nozzle ascending while sucking an electronic component; and parameter storage means which stores a parameter for use in control of the camera, with the parameter including at least descent start timing when each of the suction nozzles starts descent during mounting of the electronic component, and data required for determining an imaging time necessary from when the camera starts imaging of the suction nozzle until the camera ends the imaging. Furthermore, the component mounting device includes imaging control means configured to determine imaging start timing of the camera based on the parameter stored in the parameter storage means such that imaging is completed after one suction nozzle ascending while sucking an electronic component to be mounted turns from one arrangement pitch ahead of the work position toward the work position and immediately before the suction nozzle starts descent at the work position.

Another aspect of the present disclosure is a method for capturing an image of a nozzle of a component mounting device during mounting of an electronic component using the component mounting device. The component mounting device is configured to turn a nozzle holder turnable around an axis to alternatively move a plurality of suction nozzles disposed along a circumference concentric with a center of rotation of the nozzle holder and at an interval of an arrangement pitch in a circumference direction to a work position set on the circumference in advance, as well as allowing the nozzle holder to move on a plane such that the suction nozzle at the work position moves between a position for sucking an electronic component and a position for mounting a sucked electronic component. The method includes the steps of storing, in advance, descent start timing when each of the suction nozzles starts descent during mounting of the electronic component, and data required for determining an imaging time necessary from when a camera, which is configured to be capable of capturing an image of a side portion of a suction nozzle ascending while sucking the electronic component, starts imaging of the suction nozzle until the camera ends the imaging; and sucking an electronic component by each of the suction nozzles. The method also includes the steps of moving the work position of the nozzle holder to a position for mounting the electronic component to be mounted after finishing suction operation of the electronic component; and turning, along the circumference, one suction nozzle ascending while sucking an electronic component to be mounted in a process of moving the work position. The method further includes the steps of determining imaging start timing of the camera by the control means based on a parameter stored in the parameter storage means such that imaging is completed after the one suction nozzle turns from one arrangement pitch ahead of the work position toward the work position and immediately before the suction nozzle starts descent at the work position; and moving the camera at the determined imaging start timing to image the one suction nozzle.

In the component mounting device or the method for capturing an image of a nozzle thereof according to each aspect, by integrally rotating a plurality of suction nozzles disposed along a circumference centered around a predetermined axis and at an interval of an arrangement pitch in a circumference direction, a suction nozzle positioned at a work position is alternatively changed. On this occasion, since imaging start timing of a camera is determined such that imaging is completed after a suction nozzle turns from one arrangement pitch ahead of the work position toward the work position and immediately before the suction nozzle at the work position starts descent at the work position during mounting, the camera is allowed to capture an image immediately before the suction nozzle starts descent. Since this "immediately before" timing is determined based on descent start timing when each of the suction nozzles starts descent during mounting of an electronic component, and data required for determining an imaging time necessary from when the camera starts imaging of the suction nozzle until the camera ends the imaging, the "immediately before" timing is as approximate as possible to the descent start timing of the suction nozzle irrespective of a turning mode of the nozzle holder. Therefore, while a highly reliable checked image can be captured, it is not necessary to once stop mounting work for imaging because imaging is completed by the timing when the suction nozzle starts descent, so that reduction in a throughput can be avoided.

As described in the foregoing, according to the present disclosure, since imaging is determined to be completed after a suction nozzle turns from one arrangement pitch ahead of the work position toward the work position and immediately before the suction nozzle starts descent at the work position during mounting, while a checked image with high reliability can be captured, it is not necessary to once stop mounting work for imaging because imaging is completed at timing when the suction nozzle starts descent, so that reduction in a throughput can be avoided. Therefore, a highly reliable checked image can be obtained as soon as possible without requiring to wait for imaging when checking a suction nozzle yet to be mounted by imaging.

Further features, objects, configurations, and operation and effects of the present disclosure can be easily understood from the following detailed description to be read with reference to the accompanying drawings.

BRIEF DESCRIPTION OF THE DRAWINGS

FIG. 6 is a timing chart showing operation of capturing an image of a side portion of a suction nozzle.

DETAILED DESCRIPTION

In the following, preferred embodiments of the present disclosure will be described with reference to the accompanying drawings.

Figure 1:
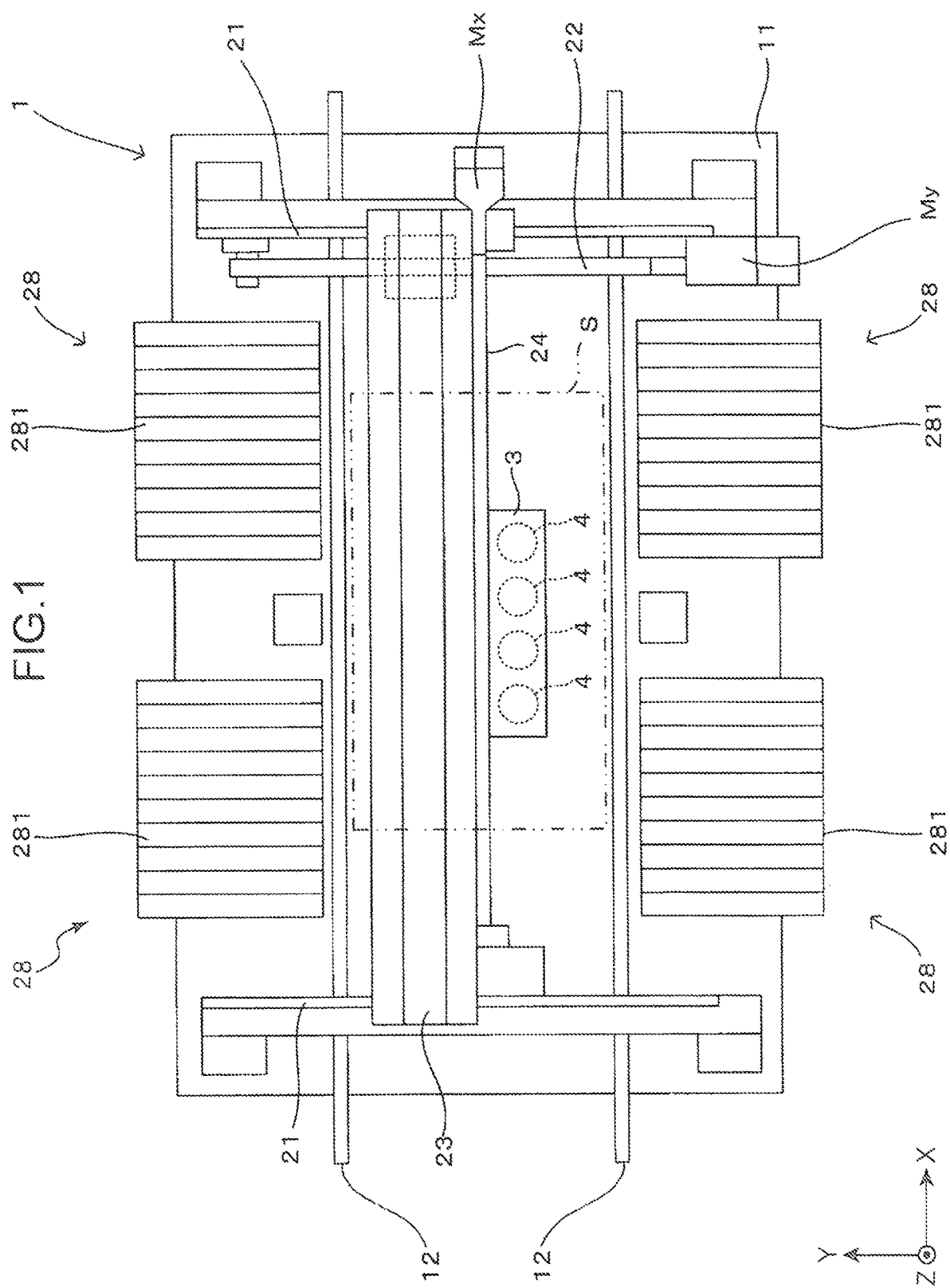
FIG. 1 is a partial plan view schematically showing a component mounting device according to the present disclosure.

As shown in FIG. 1, a component mounting device 1 is a device which horizontally transports a substrate S to be processed along one transportation direction, and after mounting an electronic component on the substrate, transports the substrate to a downstream side in the transportation direction. In the following description, direction will be described on the basis of XYZ rectangular coordinates with the transportation direction of the substrate S as an X axis direction and a vertical direction as a Z axis direction.

The component mounting device 1 includes a pair of conveyors 12, 12 provided on a base 11. Then, the component mounting device 1 mounts an electronic component on the substrate S transported by the conveyor 12 from an upstream side in the substrate transportation direction (the X axis direction) to a mounting processing position (a position of the substrate S in FIG. 1), and transports the substrate S with the component mounted thereon from the mounting processing position to the downstream side in the X axis direction by the conveyor 12. Two component supply portions 28 are arranged on each of both sides of the base 11 of the component mounting device 1 with the pair of conveyors 12, 12 sandwiched in a Y axis direction, each of the component supply portions being aligned in the X axis direction. A plurality of tape feeders 281 are attached to each of the component supply portions 28 so as to be detachably arranged in the X axis direction, and in each of the tape feeders 281, a reel is arranged around which a tape housing small piece electronic components (chip components) such as an integrated circuit, a transistor, and a capacitor at predetermined intervals is wound. Then, by intermittently feeding out the tape to a mounting head 3 side, the tape feeder 281 supplies electronic components in the tape.

For mounting an electronic component supplied from the component supply portions 28 onto the substrate S transported by the pair of conveyors 12, 12 to the mounting processing position, the component mounting device 1 is provided with the mounting head 3, a plurality of head units 4 supported by the mounting head 3, and a mechanism which drives the mounting head 3. Each of the head units 4, in which a plurality of suction nozzles 40 are supported, is configured to allow each of the suction nozzles 40 to move between a position for sucking an electronic component from a predetermined component supply portion 28 and a position for mounting an electronic component on the substrate S transported to the mounting processing position as a result of driving of the mounting head 3 on an XY plane as will be described later.

First, description will be made of the mechanism which drives the mounting head 3 on the XY plane.

The component mounting device 1 is provided with a pair of Y-axis rails 21, 21 extending in the Y axis direction, a Y-axis ball screw mechanism 22 extending in the Y axis direction, and a Y-axis motor My which drives the Y-axis ball screw mechanism 22 to rotate. A head supporting member 23 which supports the mounting head 3 is supported by the pair of Y-axis rails 21, 21 so as to be movable in the Y axis direction. The head supporting member 23 is fixed to a nut of the Y-axis ball screw mechanism 22. The head supporting member 23 is a structure longitudinally extending along the X axis direction. An X-axis ball screw mechanism 24 extending in the X axis direction and an X-axis motor Mx which drives the X-axis ball screw mechanism 24 to rotate are attached to the head supporting member 23. In a state being supported so as to be movable in the X axis direction, the mounting head 3 is fixed to a nut of the X-axis ball screw mechanism 24. A drive control portion 130 is capable of causing the Y-axis motor My to rotate the Y-axis ball screw mechanism 22, thereby causing the mounting head 3 to move in the Y axis direction, or causing the X-axis motor Mx to rotate the X-axis ball screw mechanism 24, thereby causing the mounting head 3 to move in the X axis direction. Thus, the Y-axis ball screw mechanism 22, the Y-axis motor My, the head supporting member 23, the X-axis ball screw mechanism 24, and the X-axis motor Mx form a horizontal movement unit 150 (see FIG. 5) configured to allow the nozzle head 4 to move, on a plane, between a position at which the suction nozzle 40 sucks an electronic component and a position at which the suction nozzle 40 mounts a sucked electronic component. The horizontal movement unit 150 is one example of horizontal movement means of the present disclosure.

Next, the mounting head 3 is a structure having a rectangular solid-shape which is a rectangle long in the X axis direction when viewed from the top. The mounting head 3 has the plurality of nozzle heads 4 (four in the illustrated example) linearly aligned at intervals in the X axis direction.

Figure 2:
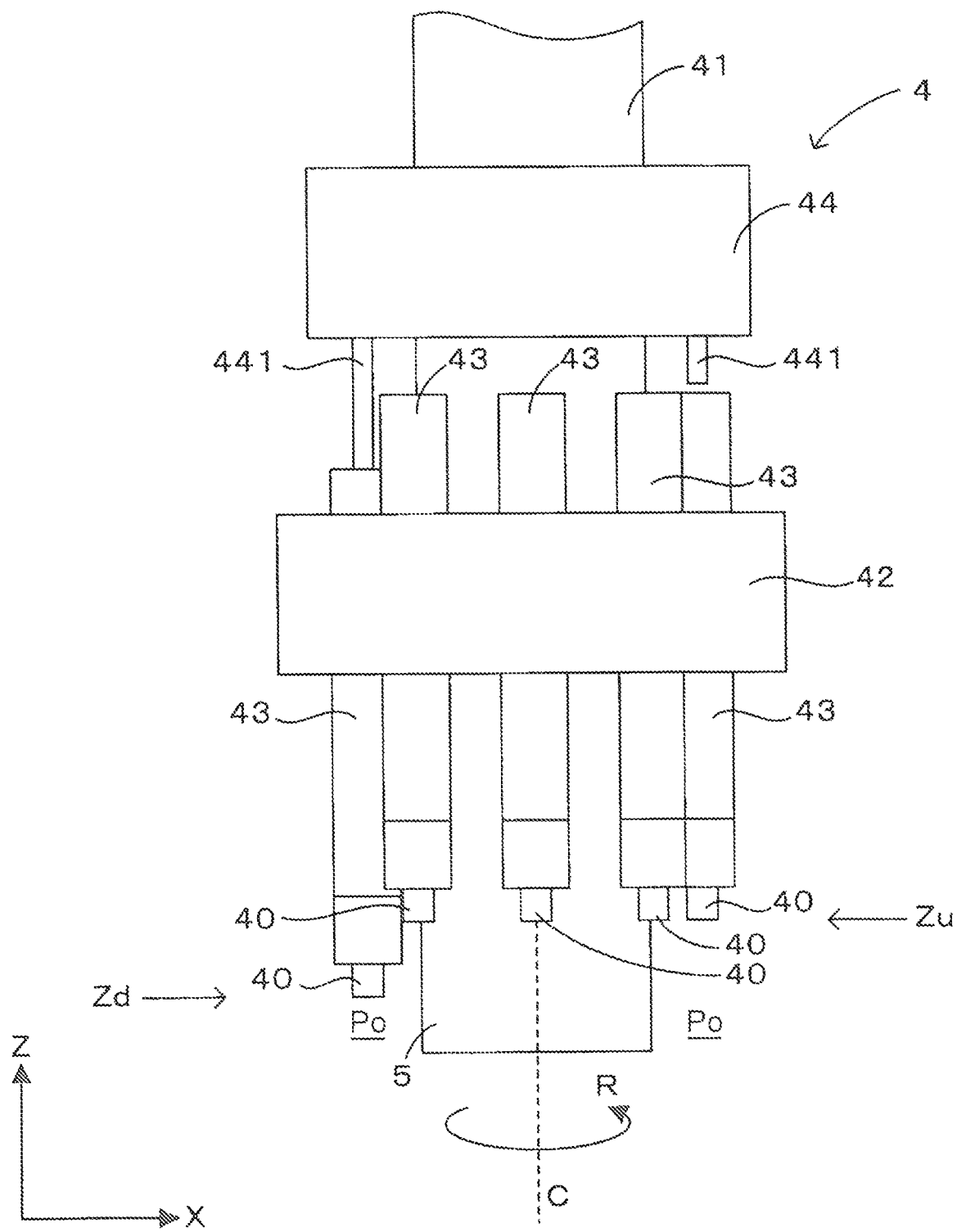
FIG. 2 is a partial front view schematically showing the vicinity of a lower end portion of one example of a mounting head.
Figure 3:
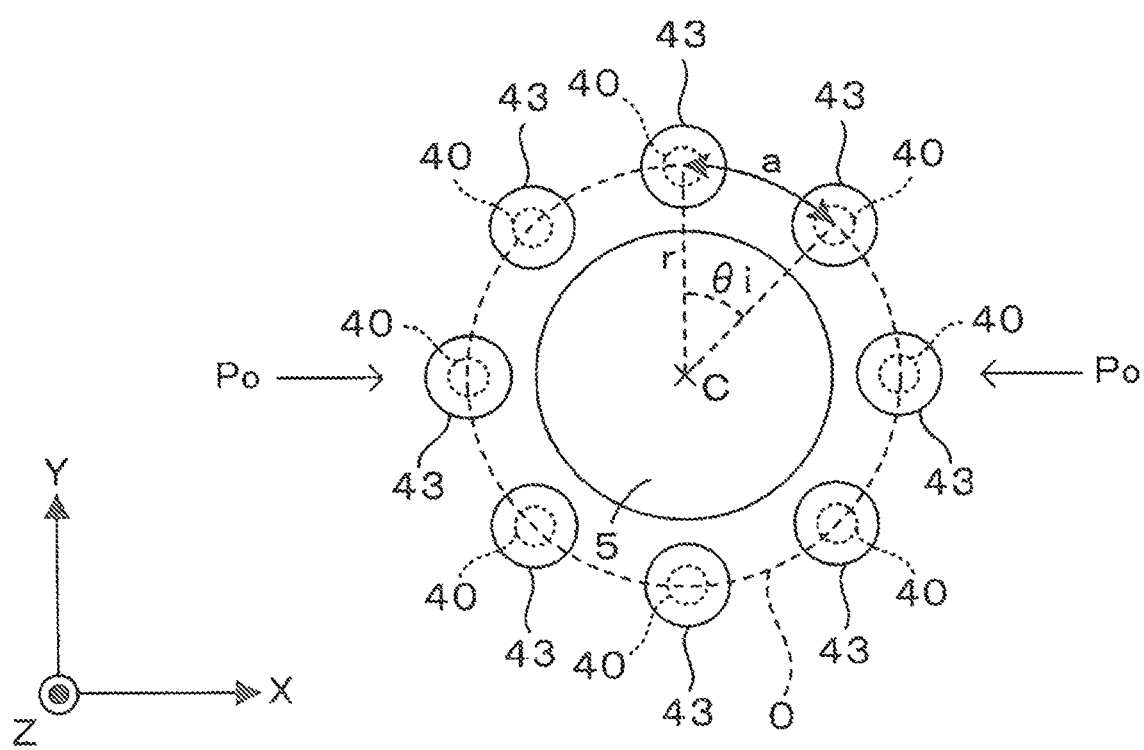
FIG. 3 is a partial plan view schematically showing a bottom portion of the mounting head shown in FIG. 2.

As shown in FIGS. 2 and 3, each of the nozzle heads 4 is a rotary head with the plurality of suction nozzles 40 arranged on a circumference. As will be described next, the nozzle head 4 sucks/mounts an electronic component by the suction nozzles 40. In the following, a configuration of the nozzle head 4 will be described with reference to FIGS. 2 and 3. Since the four nozzle heads 4 have a common configuration, description herein will be made of one nozzle head 4.

With reference to FIGS. 2 and 3, the nozzle head 4 has set a rotation center C along the Z axis direction (i.e., a vertical line direction). The nozzle head 4 has a main shaft 41 extending along the rotation center C, a nozzle holder 42 supported at a lower end of the main shaft 41 rotatably around the rotation center C so as to support the suction nozzle 40, an R-axis motor Mr which drives the nozzle holder 42 to rotate, and a nozzle up-down unit 44 arranged above the nozzle holder 42 and fixed to the main shaft 41.

The main shaft 41 is a structure which supports the nozzle holder 42, the nozzle up-down unit 44, and the like. The nozzle holder 42 is supported by the main shaft 41 so as to be rotatable along the rotation center C in a rotation direction R, which is a clockwise direction viewed from the bottom. The nozzle holder 42 has as many up-down shafts 43 as the number of the suction nozzles 40. The up-down shafts 43 are disposed at equal intervals on a circumference O, and have lower ends to which the suction nozzles 40 are detachably attached one by one. Specifically, an interval (arrangement pitch a) at which the up-down shafts 43 (the suction nozzles 40) are equally disposed is set to a position equally spaced from each other by a rotation angle θi on the circumference O centered around the rotation center C. In other words, the respective suction nozzles 40 are disposed at an interval of a fixed arrangement pitch a (or the rotation angle θi) along the circumference O concentric with the rotation center C of the nozzle holder 42 in the circumference direction. Here, the center of the suction nozzle 40 in the Z axis direction which defines the arrangement pitch a can be represented, for example, by a vertical line passing a geometric center of gravity of an opening by which the suction nozzle 40 sucks an electronic component, the gravity being viewed from the bottom. Additionally, for adjusting a rotation angle of an electronic component to be sucked, the suction nozzle 40 is capable of rotating on its axis in general. Accordingly, the center of the suction nozzle 40 can be represented by a center line of rotation on its axis of the suction nozzle 40 in place of a vertical line passing the geometric center of gravity of the opening. Then, the arrangement pitch a can be represented by a distance between the centers of adjacent two suction nozzles 40 along the circumference O and corresponds to a length of a circular arc having a radius r (a radius of the circumference O) from the rotation center C to the suction nozzle 40 and having the rotation angle θi as a central angle.

The number of the up-down shafts 43 (accordingly, the number of the suction nozzles 40) is, for example, 8 to 20 (8 in the illustrated example). Each of the up-down shafts 43 is supported by the nozzle holder 42 so as to be capable of going up and down and energized upward by an energizing member (not shown).

The R-axis motor Mr (FIG. 5) is provided in an upper end portion of the main shaft 41, and the nozzle holder 42 rotates upon receiving a driving force of the R-axis motor Mr (FIG. 5) of the nozzle head 4. Therefore, each of the suction nozzles 40 held by the nozzle holder 42 moves around the circumference O to alternatively move to a work position Po. Thus, the R-axis motor Mr is one example of turning means configured to allow the nozzle holder 42 to turn along the circumference O such that each of the suction nozzles 40 alternatively moves to the work position Po.

Figure 5:
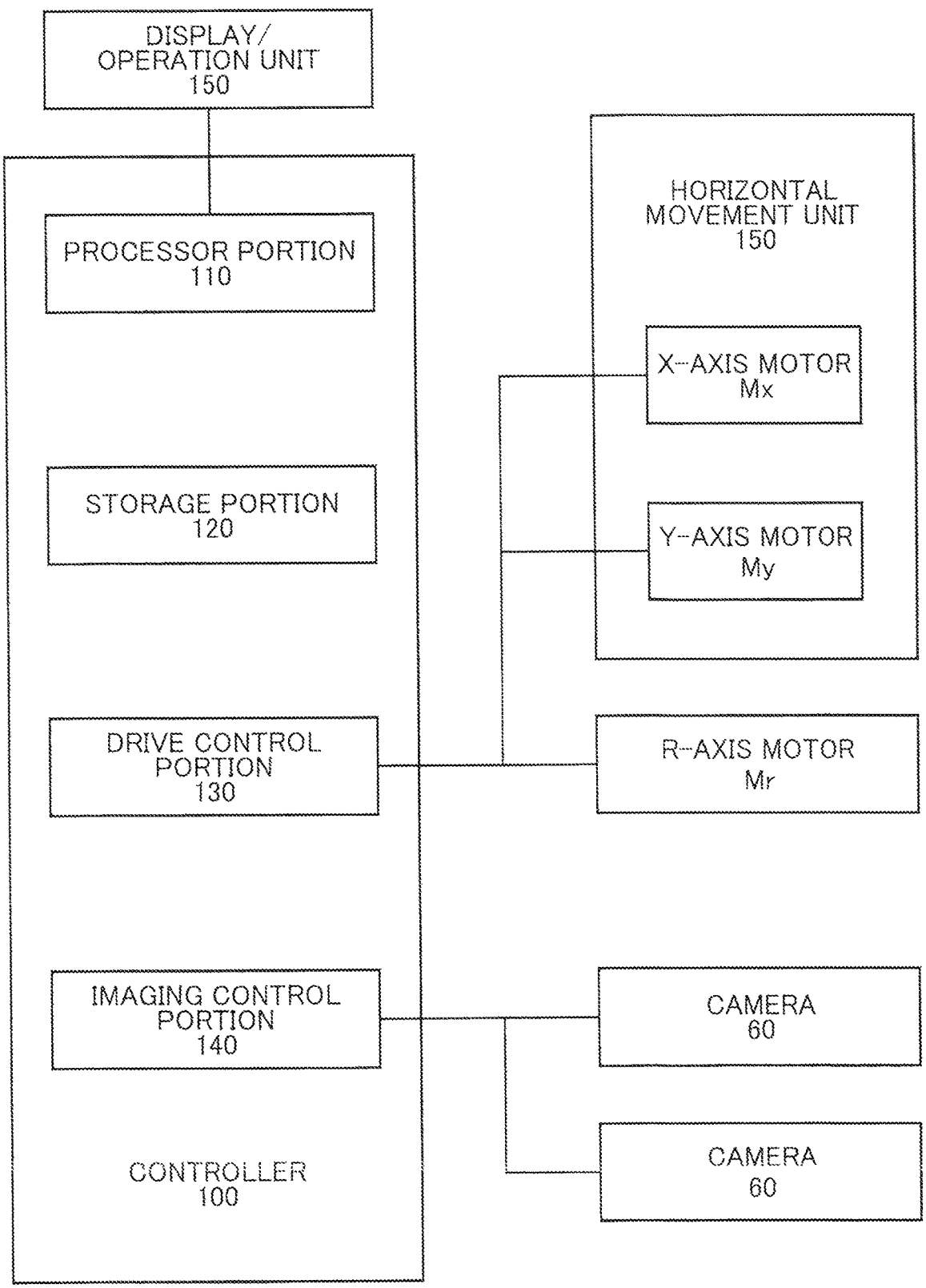
FIG. 5 is a block diagram showing an electric configuration of the component mounting device shown in FIG. 1.

The nozzle up-down unit 44 is arranged above each of the up-down shafts 43 and supported by the main shaft 41. The nozzle up-down unit 44 has two pressing members 441 arranged at an interval of 180° centered around the rotation center C, and a Z-axis motor Mz contained in the nozzle up-down unit 44 (FIG. 5). Each of the pressing members 441 goes up and down independently from each other upon receiving a driving force of the Z-axis motor Mz. When the pressing member 441 causes one up-down shaft 43 positioned immediately below the pressing member 441 to descend, the up-down shaft 43 descends against an energizing force to cause the suction nozzle 40 to descend to a descent position Zd for sucking or mounting an electronic component. On the other hand, when the pressing member 441 ascends, the one up-down shaft 43 being pressed by the pressing member 441 ascends together with the suction nozzle 40 due to an energizing force of the energizing member (not shown). This causes the suction nozzle 40 to ascend to an ascent position Zu. In FIG. 2, with respect to a lower end of the suction nozzle 40, the descent position Zd and the ascent position Zu are both illustrated. Thus, the nozzle up-down unit 44 is one example of up-down means configured to be capable of causing the suction nozzle 40 at the work position Po to go up and down.

In the present embodiment, on the circumference O, a position immediately below the pressing member 441 is the work position Po, at which work position Po, the suction nozzle 40 executes sucking/mounting of an electronic component. Specifically, in the present embodiment, the two work positions Po, Po are set centered around the rotation center C at an interval of 180° in the nozzle head 4 so as to correspond to arrangement of the above-described two pressing members 441. On the other hand, the nozzle holder 42 is provided with four pairs (suction nozzle pairs) of the suction nozzles 40, each pair having two suction nozzles arranged to be centered around the rotation center C at an interval of 180° (the two suction nozzles 40 positioned opposite to each other with the rotation center C provided therebetween) as shown in FIG. 3, in which a total of 2×4 (=8) of the suction nozzles 40 are aligned along the circumference O. Thus paired two suction nozzles 40 satisfy an arrangement relation in which one suction nozzle 40 can be positioned at one work position Po, while the other suction nozzle 40 can be positioned at the other work position Po. Accordingly, in the illustrated embodiment, two suction nozzles 40, 40 forming an arbitrary one suction nozzle pair can be positioned at the work positions Po, Po, respectively, for use in sucking/mounting of an electronic component. For example, when sucking an electronic component at the work position Po, the nozzle head 4 is moved upward of the component supply portions 28 to position the work position Po immediately above the tape feeder 281. In this state, while stopping the suction nozzle 40 which will not suck an electronic component at the work position Po in the rotation direction R, the suction nozzle 40 is caused to descend from the ascent position Zu to the descent position Zd in the Z axis direction. Then, at timing when the suction nozzle 40 comes into contact with an electronic component supplied from the tape feeder 281, a negative pressure is applied to the suction nozzle 40 to suck an electronic component from the tape feeder 281 to the suction nozzle 40. Subsequently, the suction nozzle 40 having sucked the electronic component is caused to ascend from the descent position Zd to the ascent position Zu in the Z axis direction.

In a case of mounting an electronic component at the work position Po, the nozzle head 4 is moved upward of the substrate S to position the work position Po immediately above a mounting target part of the substrate S. In this state, while stopping the suction nozzle 40 which will suck an electronic component at the work position Po in the rotation direction R, the suction nozzle is caused to descend from the ascent position Zu to the descent position Zd in the Z axis direction. Then, at timing when an electronic component comes into contact with the substrate S, an atmospheric pressure or a positive pressure is applied to the suction nozzle 40 to mount the electronic component from the suction nozzle 40 onto the substrate S. Subsequently, the suction nozzle 40 from which the electronic component is released is caused to ascend from the descent position Zd to the ascent position Zu in the Z axis direction.

Thus, in the present embodiment, the horizontal movement unit 150 is configured to allow the nozzle holder 42 to be movable on a plane such that the suction nozzle 40 at the work position Po moves between a position for sucking an electronic component and a position for mounting a sucked electronic component, and the nozzle up-down unit 44 functions as up-down means configured to enable the suction nozzle 40 at the work position Po to go up and down.

Next, a columnar light diffusion member 5 is attached to a lower end of the main shaft 41 of the nozzle head 4, and the plurality of suction nozzles 40 are aligned to surround the light diffusion member 5. The light diffusion member 5 has an identical configuration to that of the diffusion member recited, for example, in Unexamined Japanese Patent Publication No. 2012-238726, and is used in side portion imaging for capturing an image of a side portion (Side View) of the suction nozzle 40 by an imaging unit 6 (FIG. 4) to be detailed later, the side portion of the suction nozzle 40 being viewed from the X axis direction.

The imaging unit 6 includes a camera 60 (FIG. 5) which captures an image of a side portion of the suction nozzle 40. The camera 60 is configured to operate under the control of an imaging control portion 140 of a controller 100 to capture, at a position before or after the work position Po in the rotation direction R, an image of a side portion of the suction nozzle 40 moving at a height of the ascent position Zu or having finished moving.

Figure 4:
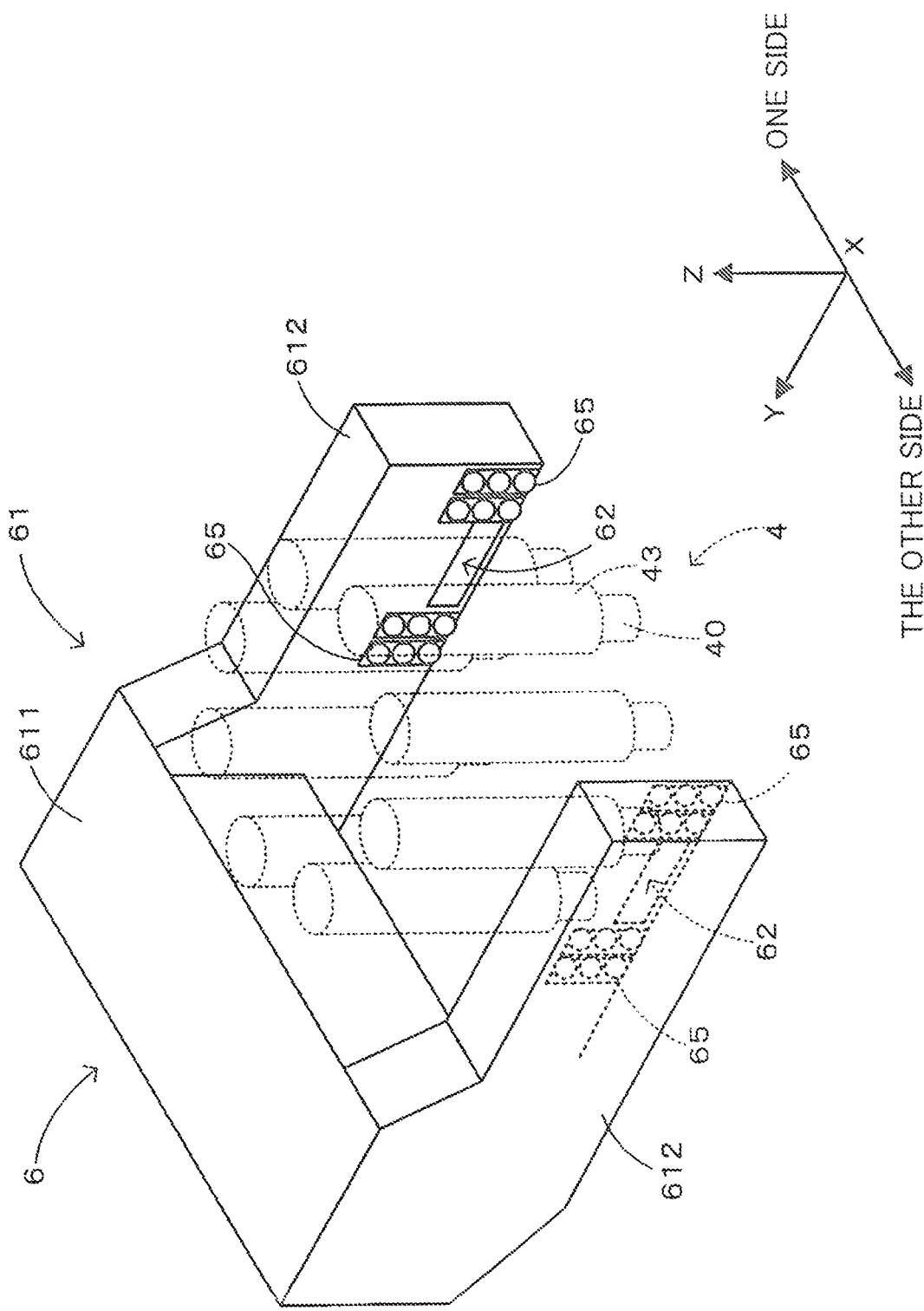
FIG. 4 is a partial perspective view schematically showing an outer appearance of an imaging unit.

Next, with reference to FIG. 4, a configuration of the imaging unit 6 will be described. For illustrating a relation with the nozzle head 4, the configuration of the nozzle head 4 is simplified in FIG. 4.

The imaging unit 6 includes a casing 61 with the camera 60 (FIG. 5) provided therein. The casing 61 has a main body portion 611 provided to extend in the X axis direction, and a pair of two suction nozzle opposed portions 612, 612 protruding, in the Y axis direction, from both ends of the main body portion 611 in the X axis direction. In the casing 61, the camera 60 is arranged in each of the suction nozzle opposed portions 612. Then, the two suction nozzle opposed portions 612, 612 are arranged with the plurality of suction nozzles 40 provided therebetween in the X axis direction, and are fixed to the main shaft 41. Thus, the imaging unit 6 is configured integrally with the nozzle head 4 and is movable along with the nozzle head 4. A window 62 opposed to the work position Po of the nozzle head 4 from the X axis direction is provided on an inner wall of each of the suction nozzle opposed portions 612. Then, each of the cameras 60, which is opposed to the work position Po from the X axis direction via the window 62, captures an image of the vicinity of the work position Po from the X axis direction. As described above, as the pressing member 441 goes up and down, the suction nozzle 40 goes up and down between the ascent position Zu and the descent position Zd. By contrast, each of the windows 62 is provided at a height of the ascent position Zu, and each of the cameras 60 captures an image of the vicinity of the work position Po at the ascent position Zu from the X axis direction (a horizontal direction).

Next, a lighting 65 is provided on the inner wall of each of the suction nozzle opposed portions 612. Each lighting 65 is configured with a plurality of LEDs (Light Emitting Diode) aligned in a matrix on both sides of the window 62, and radiate light toward the work position Po. In this manner, for each of the windows 62, the lightings 65 are provided which are opposed to each other with the nozzle head 4 and the light diffusion member 5 provided therebetween, so that each of the cameras 60 captures a silhouette image at the work position Po illuminated from a back side with light emitted from the lighting 65 and diffused by the light diffusion member 5.

The camera 60 of the present embodiment, which includes a plurality of telecentric lenses and imaging elements, captures an image of a side portion of an electronic component sucked and held by the suction nozzle 40. The camera 60 is set at the same height as that of an electronic component of the suction nozzle 40 at the ascent position Zu.

The imaging element is constantly exposed with light incident from the lens of the camera 60. In other words, the imaging element is configured with numbers of imaging unit elements arranged in a matrix. Each of the imaging unit elements stores electric charges according to brightness of incident light on an imaging unit element basis. When an imaging command is output to the camera 60, the electric charges stored (charged) in each imaging unit element is output, in response to the command, to a circuit (not shown) which generates image data in the camera 60. Image data as data of an image is generated according to an amount of electric charges of each imaging unit element, i.e., each pixel, output in the circuit. In this manner, imaging by the camera 60 is executed. The image data is generated as digital data including illumination information of each pixel (color information may be further included). As an imaging element, a CMOS sensor or a CCD sensor can be used. Electric charges of the imaging element will be reset to 0 when discharged upon an imaging command. In other words, the amount of the electric charges of the imaging element remains zero to have a "jet-black (black only)" image after the electric charges are output unless new light is emitted from the lens of the camera 60. With thus formed camera 60, a "waste discharge" processing of discharging electric charges of the imaging element for resetting in each imaging is executed, and then "main imaging" processing of obtaining an image is executed. Therefore, the camera 60 is configured such that a waste discharging offset t1 and a main imaging time t2 are stored in a storage portion 120 as eigenvalues of the camera 60, and such that a sum of these values (t1+t2) can be processed as "imaging time SV" in control of the imaging control portion 140 to be described later. The waste discharging offset t1 is time from reception of an imaging command until completion of discharging. An imaging time of the main imaging is time from output of a signal commanding execution of the main imaging after a lapse of the waste discharging offset until completion of the main imaging.

As shown in FIG. 5, the component mounting device 1 includes the controller 100 which totally controls the entire device. The controller 100 has a processor portion 110 which is a computer configured with a CPU (Central Processing Unit) and a RAM (Random Access Memory), and the storage portion 120 configured with an HDD (Hard Disk Drive). Further, the controller 100 has the processor portion 110, the drive control portion 130 which controls a drive system of the component mounting device 1 and the imaging control portion 140 which controls imaging of the suction nozzle based on calculation results of the processor portion 110, and a display/operation unit 160.

By controlling the drive control portion 130 and the imaging control portion 140 according to a program stored in the storage portion 120, the processor portion 110 executes component mounting processing and imaging processing before and after mounting a component which processings are defined by the program. Additionally, the processor portion 110 displays a condition of the component mounting device 1 on the display/operation unit 160 and receives an instruction from an operator, the instruction being input to the display/operation unit 160.

In the storage portion 120, a program to be executed by the processor portion 110 and parameters required for executing the program are stored. As will be described later in detail, the parameters include, in addition to various values (an output voltage, a rotation speed, etc.) necessary for controlling the respective motors Mx, My, Mz, and Mr, end timing of the turning motor Mr (or a stop position (or an angle) determined for each of the suction nozzles 40) at the time of moving a corresponding work position Po to a position immediately above a component mounting position of the substrate S, a position (or an angle θi) of each of the suction nozzles 40 in the circumference direction with a predetermined reference position as a starting point on the circumference O, a driving amount required for moving each of the suction nozzles 40 to each work position, descent start timing (or an angle when starting descent to the work position Po) when the corresponding suction nozzle 40 starts descent at the work position Po during mounting of an electronic component, and data required for determining the imaging time SV necessary for the camera 60 to end imaging of the suction nozzle after start thereof. Here, the data required for determining the imaging time SV is a sum of the above-described waste discharging offset t1 and main imaging time t2. The imaging time SV does not need to be held as a value and may be a derivation function obtained by calculating a sum of the waste discharging offset t1 and the imaging time t2 of main imaging for each processing.

The X-axis motor Mx and the Y-axis motor My configuring the horizontal movement unit 150, the Z-axis motor Mz configuring the nozzle up-down unit 44, and the R-axis motor Mr as the turning means are connected to the drive control portion 130.

When the drive control portion 130 outputs a rotation command to the R-axis motor Mr, the R-axis motor Mr configuring the turning means rotates, so that the nozzle holder 42 rotates in response to a driving force of the rotation, while the suction nozzles 40 integrally rotate along the circumference O. This enables a suction nozzle sucking a predetermined electronic component to alternatively move to any of the work positions Po.

When the drive control portion 130 outputs a rotation command to the Y-axis motor My, the Y-axis motor My rotates, and in response to a driving force of the rotation, the Y-axis ball screw mechanism 22 rotates. Therefore, the mounting head 3 moves in the Y direction via the head supporting member 23 attached to the nut of the Y-axis ball screw mechanism 22. Additionally, when the drive control portion 130 outputs the rotation command to the X-axis motor Mx, the X-axis motor Mx rotates, and in response to a driving force of the rotation, the X-axis ball screw mechanism 24 rotates. Therefore, the mounting head 3 attached to the nut of the X-axis ball screw mechanism 24 moves in the X direction. In this manner, the X-axis motor Mx and the Y-axis motor My configuring the horizontal movement unit 150 are allowed to move the suction nozzle 40 at the work position Po, among the suction nozzles 40 of the nozzle holder 42 supported by the mounting head 3, between a position for sucking an electronic component and a position for mounting a sucked electronic component.

Further, when the drive control portion 130 outputs a descent command to the Z-axis motor Mz, the Z-axis motor Mz configuring the up-down means rotates in one direction, so that the pressing member 441 descends against an energizing force of the energizing member (not shown). As a result, the pressing member 441 causes one up-down shaft 43 positioned immediately below the pressing member among the plurality of the up-down shafts 43 to descend against an energizing force exerted on the up-down shaft 43, thereby causing the suction nozzle 40 to descend to the descent position Zd for sucking or mounting an electronic component. On the other hand, when the drive control portion 130 outputs an ascent command to the Z-axis motor Mz, the Z-axis motor Mz rotates in the other direction, so that the pressing member 441 ascends in response to a driving force from the energizing member (not shown). As a result, the one up-down shaft 43 being pressed down by the pressing member 441 ascends along with the suction nozzle 40, so that the suction nozzle 40 ascends to the ascent position Zu. In FIG. 2, for the lower end of the suction nozzle 40, the descent position Zd and the ascent position Zu are both illustrated.

On the other hand, the imaging control portion 140, which is connected to each of the cameras 60, controls imaging timing of each of the cameras 60 to complete the imaging processing before one suction nozzle 40 starts descending at the work position Po. Specifically, first, when sucking an electronic component, an image of a side portion of the suction nozzle 40 positioned at the ascent position Zu is captured at each timing before and after suction of an electronic component. Then, when a foreign matter is attached to the suction nozzle 40 in an image of a side portion before suction of a component, suction of the component is cancelled. When no electronic component is present at the lower end of the suction nozzle 40 in an image of the side portion after the suction nozzle 40 is caused to descend to the descent position Zd for component suction, determination is made that component suction fails at predetermined timing to again execute component suction. Further, a thickness or posture of an electronic component to be sucked by the suction nozzle 40 is appropriately determined based on a side portion image of the suction nozzle 40.

Next, when mounting an electronic component, an image of a side portion of the suction nozzle 40 positioned at the ascent position Zu is captured at each timing before and after mounting of an electronic component. Then, when no electronic component is present at the lower end of the suction nozzle 40 in an image of a side portion before mounting of a component, determination is made that an electronic component has dropped off from the suction nozzle 40 to cancel mounting of a component. When an electronic component is left at the lower end of the suction nozzle 40 in an image of the side portion after the suction nozzle 40 is caused to descend to the descent position Zd for mounting a component, determination is made that mounting of a component has failed to again execute mounting of a component.

In this manner, the controller 100 of the present embodiment is configured to control the horizontal movement unit 150 and the R-axis motor Mr such that after each of the suction nozzles 40 completes each electronic component suction operation, in a process of movement of the work position Po of the nozzle holder 42 to a position for mounting an electronic component to be mounted, one suction nozzle 40 ascending while sucking the electronic component turns along the circumference O to arrive at the work position Po. The controller 100 is also configured to control the nozzle up-down unit 44 and the camera 60 such that the imaging processing is completed before one suction nozzle 40 starts descending at the work position Po.

Here, for imaging of a side portion before mounting a component, imaging timing is in particularly important. Even in a mode like the present embodiment in which an image of a side surface of the suction nozzle 40 at a work position is captured, there occurs a case where at the stage of arrival of the suction nozzle at the work position, the nozzle head 4 is still driven by the horizontal movement unit 150. In such a case, it is preferable that imaging ends immediately before the horizontal movement unit 150 stops (preferably after the stop). This is because an electronic component might deviate or fall off from the suction nozzle 40 due to effect of inertia at the time of being driven by the horizontal movement unit 150. On the other hand, when timing to start imaging (imaging start timing) by the camera 60 delays too much, the suction nozzle 40 cannot be caused to descend until the completion of the imaging, so that a throughput might be reduced.

Thus, the imaging control portion 140 according to the present embodiment determines imaging start timing by a method described in the following. Since imaging operations executed by the two cameras 60 provided in the imaging unit 6 are similar in the present embodiment, description will be herein made of imaging operation by one camera 60.

With reference to FIG. 6, for allowing the suction nozzle 40 sucking an electronic component to be mounted to move to the work position Po, the present embodiment is set to drive the horizontal movement unit 150 and the R-axis motor Mr substantially at the same time, operate the Z-axis motor Mz at timing when both the horizontal movement unit 150 and the R-axis motor Mr have stopped to cause the pressing member 441 to descend, thereby pushing down the suction nozzle 40 stopping at the work position Po.

In this case, since timing Tc is known when the suction nozzle 40 completes descent at the work position Po between the work position Po and a position (Po−1) one position before the work position Po as shown in FIG. 6, timing before a sum (Td+SV) of time Td required for descent of the suction nozzle 40 and the imaging time SV can be set as follows:

$$Tm = Tc - (Td + SV) \qquad (1)$$

In a case where movement start timing Tp when one of the motors Mx and My of the horizontal movement unit 150 first starts driving is known in addition to the timing Tc, the following waiting time can be calculated based on a lapse of time Te from the movement start timing Tp of the horizontal movement unit 150 until the timing Tc:

$$Txy = Te - (Td + SV) \qquad (2),$$

to obtain the following timing after a lapse of a waiting time Txy after the movement start timing Tp:

$$Tm = Tp + Txy \quad (3).$$

When Expression (1) or (3) is used, imaging timing can be precisely calculated not only in a case where the Z-axis motor Mz starts moving after the horizontal movement unit 150 completely stops as shown in FIG. 6, but also in a case where the Z-axis motor Mz starts moving in a process of stop of the horizontal movement unit 150.

In the illustrated embodiment, timing of completion of imaging is substantially the same as descent start timing Ts, and time Rt from the imaging start timing Tm until the timing Tc of completion of component mounting becomes as short as possible.

By contrast, in the configuration recited in Unexamined Japanese Patent Publication No. 2009-130014, in which imaging of a side portion is executed before mounting, since an angle of view for capturing by a camera deviates upstream from a work position from the beginning, after execution of imaging at the timing shown by broken lines in FIG. 6, imaging of a suction nozzle moving from the imaging position to a work position is not possible. Therefore, time corresponding to Rt in the present embodiment is generally more than time for movement of one arrangement pitch to have limited reliability.

As described in the foregoing, in the component mounting device and the method for capturing an image of a nozzle thereof according to the present embodiment, by integrally rotating the plurality of suction nozzles 40 arranged at an interval of the predetermined arrangement pitch a along the circumference O, a suction nozzle 40 to be positioned at the work position Po is alternatively changed. On this occasion, the imaging control portion 140 functions also as imaging control means in the present embodiment to determine the imaging start timing Tm of the camera 60 by the controller 100 based on parameters (the descent start timing Ts, the imaging time SV) stored in a parameter storage portion 141 such that imaging is completed after one suction nozzle 40 turns along the circumference O from a position one arrangement pitch a before the work position Po and immediately before start of descent at the work position Po. Therefore, the camera 60 can capture an image of the suction nozzle 40 immediately before start of descent thereof. Since the "immediately before" timing is determined based on the descent start timing Ts when each of the suction nozzles 40 starts descent during mounting of an electronic component, and data required for determining the imaging time SV necessary from start of imaging of the suction nozzle 40 by the camera 60 until end thereof (a value of a waste imaging offset or time required for main imaging), while a field of view of the camera 60 stops at the work position Po to enable imaging of the side portion of the suction nozzle 40 at the ascent position Zu, the "immediately before" timing is approximated to be as substantially the same time as possible as the descent start timing Ts of the suction nozzle 40 irrespective of a manner of turning of the nozzle holder 42. As a result, while a highly reliable checked image can be captured, since imaging is completed at the timing when the suction nozzle 40 starts descent, it is not necessary to once stop mounting work for imaging, resulting in avoiding reduction in a throughput.

Also in the present embodiment, the imaging control portion 140 sets, as the imaging start timing Tm, timing obtained by subtracting the imaging time SV from the descent start timing Ts when one suction nozzle 40 starts descent at the work position Po during mounting. Therefore, the present embodiment enables the imaging start timing Tm for the camera 60 to be delayed to maximum.

Also in the present embodiment, the imaging control portion 140 sets the imaging start timing Tm with the movement start timing Tp of the horizontal movement unit 150 as a starting point. Therefore, the present embodiment also enables use of the movement start timing Tp of the horizontal movement unit 150 as an imaging timing parameter for the camera 60.

Additionally, in the present embodiment, the camera 60 is arranged to have an angle of view thereof including, in a field of view, the suction nozzle 40 stopping at the work position Po (in the illustrated example, right beside the work position Po). As a result, the present embodiment enables an image of a side portion of the suction nozzle 40 to be captured so as to include, within an angle of view, a most crucial position at which fall-off of a component is concerned.

Also in the present embodiment, the imaging control portion 140 determines the imaging start timing Tm of the camera 60 such that imaging is completed at turning end timing of the R-axis motor Mr. Therefore, the present embodiment enables imaging of a checked image with high precision at an instant when the suction nozzle 40 as a subject stands still.

Accordingly, since in the present embodiment, while imaging is determined to be completed immediately before the suction nozzle 40 starts descent at a work position during mounting, a highly reliable checked image can be captured, it is not necessary to once stop mounting work for imaging because imaging is completed by the descent start timing Ts when the suction nozzle 40 starts descent, so that reduction in a throughput can be avoided. Accordingly, a highly reliable checked image can be obtained as soon as possible without requiring to wait for imaging when checking the suction nozzle 40 yet to be mounted by imaging.

The present disclosure is not limited to the above embodiment but allows for various modifications to the above without departing from the gist of the present disclosure.

For example, although in the illustrated embodiment, the angle of view of the camera 60 is directed to the suction nozzle 40 at the work position Po, the arrangement is not limited thereto, but the camera may be arranged upstream of the work position Po in the rotation direction R.

Additionally, although in the above embodiment, the nozzle head 4 includes the two work positions Po, the present disclosure is applicable also to the nozzle head 4 including a single work position Po. In such a case, the number of the suction nozzles 40 may not be limited to an even number but may be an odd number.

Also, although in the above embodiment, the plurality of nozzles 40 are aligned at an equal interval of the arrangement pitch a along the circumferential orbit O, the arrangement pitch a at which the plurality of nozzles 40 are aligned does not need to be equal but may be different.

Although in the embodiment, the camera 60 is provided at each work position Po, prisms or mirrors may be arranged in place of these cameras 60 such that one camera captures images of the suction nozzles 40 at both work positions Po.

Although in the above embodiment, the lighting 65 is provided in the casing 61 in the imaging unit 6 as imaging means, the lighting 65 may be arranged on the lower end of the main shaft 41.

In a case where imaging start timing T of the camera 60 is associated with turning timing of the R-axis motor Mr, the imaging control portion 140 preferably controls turning start timing of the R-axis motor Mr and controls the imaging start timing Tm so as to approximate turning end timing thereof to the descent start timing Ts of the suction nozzle 40. In such a case, an image of the side portion of the suction nozzle 40 can be captured at preferable timing by using association between the camera and the R-axis motor Mr, while maintaining the association between the camera and the R-axis motor Mr.

A first aspect of the present disclosure is a component mounting device including a nozzle holder configured to be turnable around an axis; and a plurality of suction nozzles configured to be capable of sucking an electronic component. The suction nozzles are disposed along a circumference concentric with a center of rotation of the nozzle holder and at an interval of an arrangement pitch in a circumference direction. The component mounting device further includes horizontal movement means configured to allow the nozzle holder to move on a plane such that the suction nozzle at a work position set on the circumference in advance moves between a position for sucking an electronic component and a position for mounting a sucked electronic component; turning means configured to allow the nozzle holder to be turnable along the circumference such that each of the suction nozzles alternatively moves to the work position; up-down means configured to allow the suction nozzle at the work position to go up and down. In addition, the component mounting device includes a camera configured to be capable of capturing an image of a side portion of the suction nozzle ascending while sucking an electronic component; parameter storage means which stores a parameter for use in control of the camera, the parameter including at least descent start timing when each of the suction nozzles starts descent during mounting of the electronic component, and data required for determining an imaging time necessary from when the camera starts imaging of the suction nozzle until the camera ends the imaging. Furthermore, the component mounting device includes imaging control means configured to determine imaging start timing of the camera based on the parameter stored in the parameter storage means such that imaging is completed after one suction nozzle ascending while sucking an electronic component to be mounted turns from one arrangement pitch ahead of the work position toward the work position and immediately before the suction nozzle starts descent at the work position.

Another aspect of the present disclosure is a method for capturing an image of a nozzle of a component mounting device during mounting of an electronic component using the component mounting device. The component mounting device is configured to turn a nozzle holder turnable around an axis to alternatively move a plurality of suction nozzles disposed along a circumference concentric with a center of rotation of the nozzle holder and at an interval of an arrangement pitch in a circumference direction to a work position set on the circumference in advance, as well as allowing the nozzle holder to move on a plane such that the suction nozzle at the work position moves between a position for sucking an electronic component and a position for mounting a sucked electronic component. The method includes the steps of storing, in advance, descent start timing when each of the suction nozzles starts descent during mounting of the electronic component, and data required for determining an imaging time necessary from when a camera, which is configured to be capable of capturing an image of a side portion of a suction nozzle ascending while sucking the electronic component, starts imaging of the suction nozzle until the camera ends the imaging; and sucking an electronic component by each of the suction nozzles. The method also includes the steps of moving the work position of the nozzle holder to a position for mounting the electronic component to be mounted after finishing suction operation of the electronic component; and turning, along the circumference, one suction nozzle ascending while sucking an electronic component to be mounted in a process of moving the work position. The method further includes the steps of determining imaging start timing of the camera by the control means based on a parameter stored in the parameter storage means such that imaging is completed after the one suction nozzle turns from one arrangement pitch ahead of the work position toward the work position and immediately before the suction nozzle starts descent at the work position; and moving the camera at the determined imaging start timing to image the one suction nozzle.

In the component mounting device according to a preferred aspect, the imaging control means sets, as the imaging start timing, timing obtained by subtracting the imaging time from descent start timing when the one suction nozzle starts descent at the work position during mounting. In this aspect, the imaging start timing for the camera can be delayed to maximum.

In the component mounting device according to a preferred aspect, the imaging control means sets the imaging start timing with movement start timing of the horizontal movement means as a starting point. In this aspect, the movement start timing of the horizontal movement means can also be used as an imaging timing parameter for the camera.

In the component mounting device according to a preferred aspect, the camera is arranged to have an angle of view thereof including, in a field of view, a suction nozzle at the work position. In this aspect, an image of the suction nozzle can be captured so as to include, within an angle of view, a most crucial position at which fall-off of a component is concerned.

In the component mounting device according to a preferred aspect, the imaging start timing of the camera is associated with turning timing of the turning means, the imaging control means controls turning start timing of the turning means, thereby controlling the imaging start timing. In this aspect, an image of a suction nozzle can be captured at preferable timing by using association between a camera and turning means, while maintaining the association between the camera and the turning means.

In the component mounting device according to a preferred aspect, the imaging control means determines imaging start timing of the camera such that imaging is completed at turning end timing of the turning means. In this aspect, a checked image with high precision can be captured at an instant when a suction nozzle as a subject stands still.

What is claimed is:

1. A component mounting device comprising:
a nozzle holder configured to turn around an axis;
a plurality of suction nozzles configured to suck an electronic component, the suction nozzles being disposed along a circumference concentric with a center of rotation of the nozzle holder and at an interval of an arrangement pitch in a circumference direction;
a horizontal over configured to allow the nozzle holder to move on a plane such that the suction nozzle at a work position set on the circumference in advance moves between a position for sucking an electronic component and a position for mounting a sucked electronic component;

a turning mechanism configured to allow the nozzle holder to be turnable along the circumference such that each of the suction nozzles alternatively moves to the work position;

an up-down mechanism configured to allow the suction nozzle at the work position to go up and down;

a camera configured to capture an image of a side portion of the suction nozzle ascending while sucking an electronic component;

a parameter storage configured to store a parameter for use in control of the camera, the parameter including at least descent start timing when each of the suction nozzles starts descent during mounting of the electronic component, and data required for determining an imaging time necessary from when the camera starts imaging of the suction nozzle until the camera ends the imaging; and an imaging controller configured to determine imaging start timing of the camera based on the parameter stored in the parameter storage such that imaging is completed after one suction nozzle ascending while sucking an electronic component to be mounted turns from one arrangement pitch ahead of the work position toward the work position and immediately before the suction nozzle starts descent at the work position.

2. The component mounting device according to claim 1, wherein
the imaging controller is configured to set, as the imaging start timing, timing obtained by subtracting the imaging time from descent start timing when the one suction nozzle starts descent at the work position during mounting.

3. The component mounting device according to claim 2, wherein
the imaging controller is configured to set the imaging start timing with movement start timing of the horizontal over as a starting point.

4. The component mounting device according to claim 3, wherein
the camera is arranged so as to have an angle of view including a suction nozzle at the work position.

5. The component mounting device according to claim 4, wherein
the camera has the imaging start timing executed in association with turning timing of the turning mechanism, and
the imaging controller is configured to control the imaging start timing by controlling turning start timing of the turning mechanism.

6. The component mounting device according to claim 4, wherein
the imaging controller is configured to control the imaging start timing of the camera such that imaging is completed at turning end timing of the turning mechanism.

7. The component mounting device according to claim 3, wherein
the camera has the imaging start timing executed in association with turning timing of the turning mechanism, and
the imaging controller is configured to control the imaging start timing by controlling turning start timing of the turning mechanism.

8. The component mounting device according to claim 3, wherein
the imaging controller is configured to control the imaging start timing of the camera such that imaging is completed at turning end timing of the turning mechanism.

9. The component mounting device according to claim 2, wherein
the camera is arranged so as to have an angle of view including a suction nozzle at the work position.

10. The component mounting device according to claim 9, wherein
the camera has the imaging start timing executed in association with turning timing of the turning mechanism, and
the imaging controller is configured to control the imaging start timing by controlling turning start timing of the turning mechanism.

11. The component mounting device according to claim 9, wherein
the imaging controller is configured to control the imaging start timing of the camera such that imaging is completed at turning end timing of the turning mechanism.

12. The component mounting device according to claim 2, wherein
the camera has the imaging start timing executed in association with turning timing of the turning mechanism, and
the imaging controller is configured to control the imaging start timing by controlling turning start timing of the turning mechanism.

13. The component mounting device according to claim 2, wherein
the imaging controller is configured to control the imaging start timing of the camera such that imaging is completed at turning end timing of the turning mechanism.

14. The component mounting device according to claim 1, wherein
the camera is arranged so as to have an angle of view including a suction nozzle at the work position.

15. The component mounting device according to claim 14, wherein
the camera has the imaging start timing executed in association with turning timing of the turning mechanism, and
the imaging controller is configured to control the imaging start timing by controlling turning start timing of the turning mechanism.

16. The component mounting device according to claim 14, wherein
the imaging controller is configured to control the imaging start timing of the camera such that imaging is completed at turning end timing of the turning mechanism.

17. The component mounting device according to claim 1, wherein
the camera has the imaging start timing executed in association with turning timing of the turning mechanism, and
the imaging controller is configured to control the imaging start timing by controlling turning start timing of the turning mechanism.

18. The component mounting device according to claim 17, wherein the imaging controller is configured to control the imaging start timing of the camera such that imaging is completed at turning end timing of the turning mechanism.

19. The component mounting device according to claim 1, wherein
the imaging controller is configured to control the imaging start timing of the camera such that imaging is completed at turning end timing of the turning mechanism.

20. A method for capturing an image of a nozzle of a component mounting device during mounting of an electronic component using the component mounting device, the component mounting device being configured to turn a nozzle holder turnable around an axis to alternatively move a plurality of suction nozzles disposed along a circumference concentric with a center of rotation of the nozzle holder and at an interval of an arrangement pitch in a circumference direction to a work position set on the circumference in advance, as well as allowing the nozzle holder to move on a plane such that the suction nozzle at the work position moves between a position for sucking an electronic component and a position for mounting a sucked electronic component, the method comprising:
storing, in advance, descent start timing when each of the suction nozzles starts descent during mounting of the electronic component, and data required for determining an imaging time necessary from when a camera, which is configured to capture an image of a side portion of a suction nozzle ascending while sucking the electronic component, starts imaging of the suction nozzle until the camera ends the imaging;
sucking an electronic component by each of the suction nozzles;
moving the work position of the nozzle holder to a position for mounting the electronic component to be mounted after finishing suction operation of the electronic component;
turning, along the circumference, one suction nozzle ascending while sucking an electronic component to be mounted in a process of moving the work position;
determining imaging start timing of the camera by a controller based on a parameter stored in a parameter storage such that imaging is completed after the one suction nozzle turns from one arrangement pitch ahead of the work position toward the work position and immediately before the suction nozzle starts descent at the work position; and
moving the camera at the determined imaging start timing to image the one suction nozzle.

\* \* \* \* \*